United States Patent
Klepser et al.

(10) Patent No.: US 8,674,867 B1
(45) Date of Patent: Mar. 18, 2014

(54) CAPACITIVE RADIO-FREQUENCY DIGITAL-TO-ANALOG CONVERTER WITH A SWITCHED LOAD

(71) Applicants: Bernd-Ulrich Klepser, Starnberg (DE); Franz Kuttner, St. Ulrich (AT)

(72) Inventors: Bernd-Ulrich Klepser, Starnberg (DE); Franz Kuttner, St. Ulrich (AT)

(73) Assignee: Intel Mobile Communications GmbH, Neubiberg (DE)

( * ) Notice: Subject to any disclaimer, the term of this patent is extended or adjusted under 35 U.S.C. 154(b) by 0 days.

(21) Appl. No.: 13/688,662

(22) Filed: Nov. 29, 2012

(51) Int. Cl.
*H03M 1/66* (2006.01)
(52) U.S. Cl.
USPC .......................................... 341/144; 375/295
(58) Field of Classification Search
USPC .......................................................... 341/144
See application file for complete search history.

(56) References Cited

U.S. PATENT DOCUMENTS

| | | | |
|---|---|---|---|
| 6,831,582 B2 * | 12/2004 | Kuttner et al. | 341/144 |
| 6,919,858 B2 * | 7/2005 | Rofougaran | 343/850 |
| 7,176,823 B2 * | 2/2007 | Zabroda | 341/144 |
| 8,106,803 B2 | 1/2012 | Hurwitz et al. | |
| 8,111,182 B2 * | 2/2012 | Kuttner | 341/144 |
| 8,238,845 B2 | 8/2012 | Hurwitz et al. | |
| 8,446,184 B2 * | 5/2013 | Van Der Goes et al. | 327/108 |
| 8,604,958 B2 | 12/2013 | Pfann et al. | |
| 2004/0135714 A1 | 7/2004 | Kuttner et al. | |
| 2011/0085616 A1 | 4/2011 | Kuttner | |
| 2012/0286891 A1 | 11/2012 | Schimper et al. | |
| 2013/0251068 A1 | 9/2013 | Boos et al. | |

OTHER PUBLICATIONS

U.S. Appl. No. 13/688,980, filed Nov. 29, 2012.
U.S. Appl. No. 13/688,867, filed Nov. 29, 2012.
Taoufiq Bellamine, 8 Bit Current Steering DAC, A project for ECE 547 "VLSI Design" Spring Semester 2007.
Non-Final Office Action dated Jan. 14, 2014 for U.S. Appl. No. 13/688,867. 22 Pages.
Non-Final Office Action dated Jan. 21, 2014 for U.S. Appl. No. 13/688,980. 19 Pages.

\* cited by examiner

*Primary Examiner* — Khai M Nguyen
(74) *Attorney, Agent, or Firm* — Eschweiler & Associates, LLC

(57) ABSTRACT

The present disclosure relates to a device and method to increase the dynamic bit range of a radio-frequency digital-to-analog converter. A load of the Cap-RF-DAC typically consists of a transformer, which has a transfer ratio N:M derived by the number of windings of the primary and secondary coil, respectively. The load resistance can be varied by using switchable inductors on one or both sides of the transformer to vary an inductance of one of more sides of the switchable transformer, varying the transfer ratio of a transformer resulting in a switchable trans-impedance gain of the transformer. Switchable capacitor may also be configured in parallel to the switchable transformer to keep the load impedance constant while switching the switchable transformer.

20 Claims, 7 Drawing Sheets

CAPACITIVE RADIO-FREQUENCY DIGITAL-TO-ANALOG CONVERTER WITH A SWITCHED LOAD

BACKGROUND

A dynamic bit range of a capacitive radio-frequency digital-to-analog converter (Cap-RF-DAC) is determined by a number of parallel capacitive paths which produce a multi-bit digital input signal to the Cap-RF-DAC. A current steering radio-frequency digital-to-analog converter (current steering RF-DAC) may be used. However, the number of unit cells required for a thermometer-coded current steering RF-DAC increases exponentially as the dynamic bit range is increased, which can be cost-prohibitive from a die-area perspective for a given product application. The current steering RF-DAC also has lower efficiency in wiring, power consumption, and die area compared to a Cap-RF-DAC architecture. Therefore, additional measures to increase the dynamic bit range are desired.

DETAILED DESCRIPTION

Figure 1:
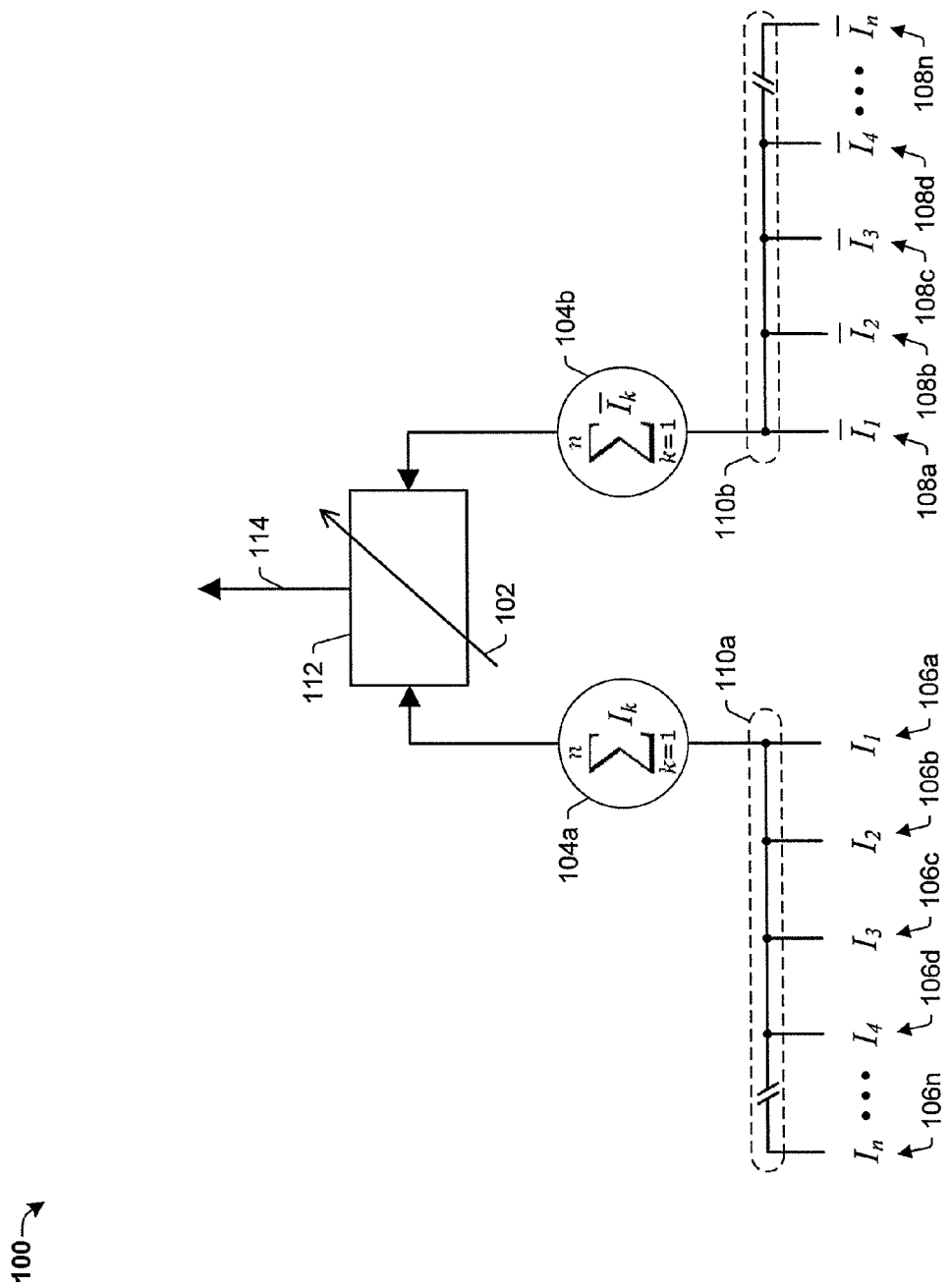
FIG. 1 illustrates an exemplary digital-to-analog converter with a programmable load.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

A dynamic bit range of a capacitive radio-frequency digital-to-analog converter (Cap-RF-DAC) is determined by a number of parallel capacitive paths which produce a multi-bit digital input signal to the Cap-RF-DAC. A current steering radio-frequency digital-to-analog converter (current steering RF-DAC) may be used in place of a Cap-RF-DAC, but a current steering RF-DAC does not exhibit a relatively linear response across a desired dynamic bit range. The number of unit cells required for a thermometer-coded current steering RF-DAC also increases exponentially as the dynamic bit range is increased, which can be cost-prohibitive from a die-area perspective for a given product application. The current steering RF-DAC also has lower efficiency in wiring, power consumption, and die area compared to a Cap-RF-DAC architecture. Therefore, additional measures to increase the dynamic bit range of the Cap-RF-DAC are desired.

Accordingly, the present disclosure relates to a device and method to increase the dynamic bit range of a radio-frequency digital-to-analog converter (RF-DAC). A load of the Cap-RF-DAC typically consists of a transformer, which has a transfer ratio N:M derived by a number of windings of the primary and secondary coil, respectively. The load resistance can be varied by using switchable inductors on one or both sides of the transformer to vary an inductance of one or more sides of the switchable transformer, varying the transfer ratio of a transformer resulting in a switchable trans-impedance gain of the transformer. A switchable capacitor is also configured in parallel to the switchable transformer to keep the load impedance constant while switching the switchable transformer, or to further increase a dynamic bit range.

FIG. 1 illustrates an exemplary digital-to-analog converter 100 with a programmable load 102, comprising a first digital input 104a comprising a plurality of first current sources 106a-106n configured in parallel and arranged to provide respective output currents based on a multi-bit digital input (i.e., n-bit). The digital-to-analog converter 100 further comprises a first current summing path 110a configured to sum output currents from the plurality of first current sources 106a-106n. To reduce capacitive coupling between the first digital input 104a and transmission media (e.g., copper wires) within the digital-to-analog converter 100 a second digital input 104b comprising a plurality of second current sources 108a-108n configured in parallel is employed, wherein a respective second current source 108a-108n comprises an inverted respective first current source (e.g., 108a is the inverse of 106a, 108b is the inverse of 106b, . . . etc.). A second current summing path 110b is configured to sum outputs from the plurality of second current sources 108a-108n to form the second digital input 104b.

The first digital input 104a and the second digital input 104b form first and second respective inputs to a switchable transformer 112 having an analog output 114. The switchable transformer 112 is configured to vary the inductance of one of more sides of the switchable transformer 112 via the programmable load 102, varying the transfer ratio of a transformer resulting in a switchable trans-impedance gain of the switchable transformer 112.

The digital-to-analog converter 100 with a programmable load 102 is utilized for such applications as to replace a function of a programmable current source in a current steering RF-DAC with a programmable load of a Cap-RF-DAC. By switching the inductance of either side of a transformer, the transfer ratio of the transformer is varied, resulting in a switchable trans-impedance gain of the transformer. When using such a switchable trans-impedance as a load to a Cap-RF-DAC the output power can be varied in addition to the capacitive unit cells, resulting in an increase of a dynamic bit range of the Cap-RF-DAC.

Figure 2:
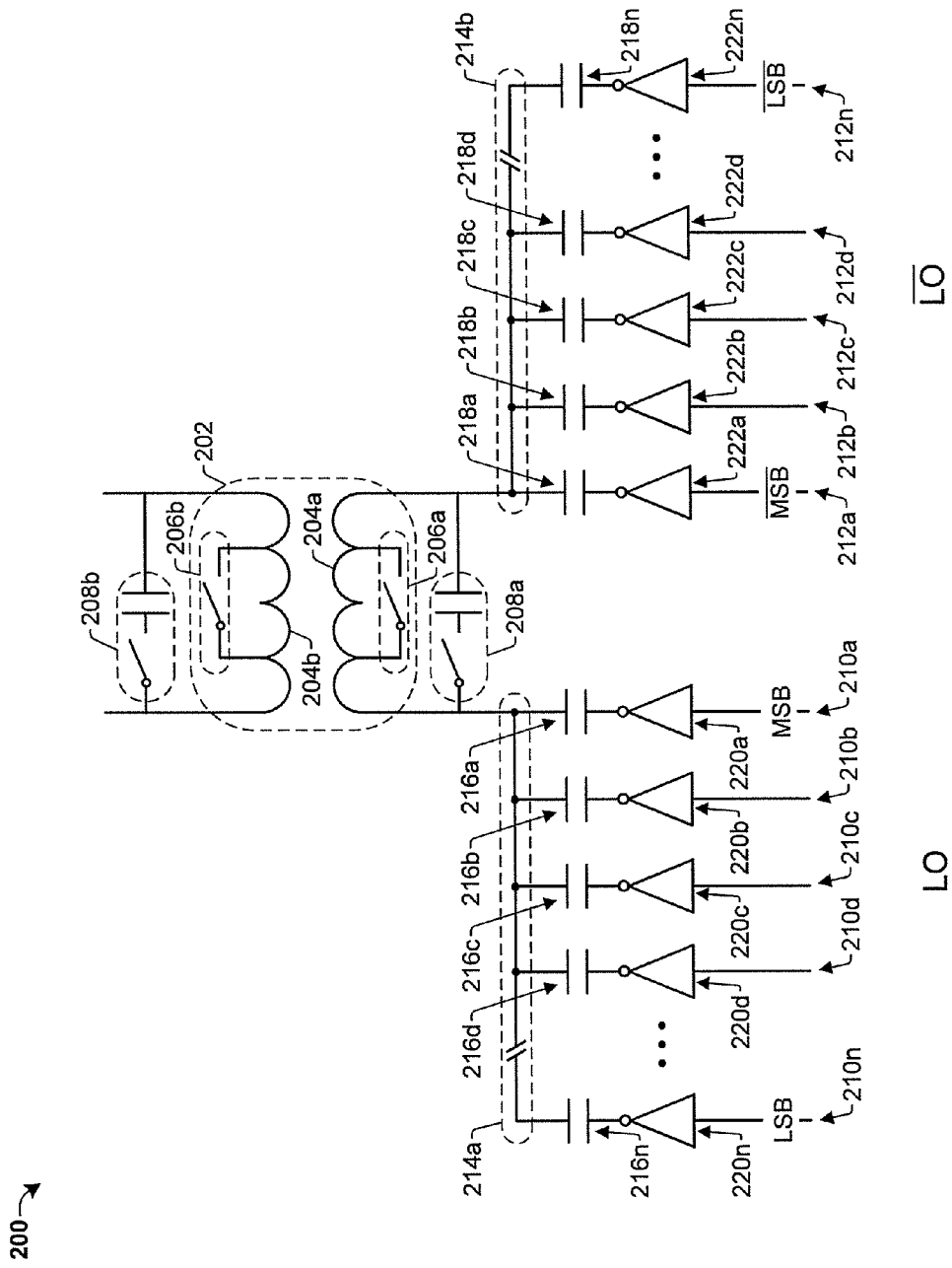
FIG. 2 illustrates an exemplary digital-to-analog converter with a programmable load comprising a switchable transformer.

FIG. 2 illustrates an exemplary digital-to-analog converter 200 with a programmable load comprising a switchable transformer 202. The switchable transformer 202 further comprises a primary coil 204a consisting of a first number of N active windings, and a secondary coil 204b consisting of a second number of M active windings. A first switch transistor 206a is connected to the primary coil 204a and configured to change the first number of active windings of the primary coil 204a from 1 to N, varying a transfer ratio of the switchable transformer between N:M and 1:M. Similarly, a second switch transistor 206b is connected to the secondary coil 204b, and configured to change the second number of active windings of the secondary coil 204b from 1 to M, varying a transfer ratio of the switchable transformer between N:M and N:1. Moreover, the first switch transistor 206a and the second switch transistor 206b are configured to operate independently, varying a transfer ratio of the switchable transformer 202 between N:1 and 1:M, resulting in a switchable transimpedance gain of the switchable transformer 202.

The digital-to-analog converter 200 further comprises a first switchable capacitor 208a configured in parallel to the primary coil 204a of the switchable transformer 202. Similarly, a second switchable capacitor 208b is configured in parallel to the secondary coil 204b of the switchable transformer 202. The first switchable capacitor 208a and the second switchable capacitor 208b are configured to operate independently, and can reduce impedance variation while switching the switchable transformer 202.

An exemplary switchable transformer 202 will have approximately 4 windings on each side comprising an N:M ratio of 1:1. The first switch transistor 206a and the second switch transistor 206b are configured to change the first number of active windings of the primary coil 204a, and the second number of active windings of the secondary coil 204b to 2 or 1, resulting in a variation of the N:M ratio from 4:1 to 1:4, which gives a factor of 16 (i.e., enumerating all possible combinations of N:M gives 16 combinations). This allows for an increased dynamic bit range contribution from the switchable transformer 202 from 1 bit to approximately 4 bits.

In combination of other measures, such as the first switchable capacitor 208a and the second switchable capacitor 208b, the dynamic bit range of the digital-to-analog converter 200 may be increased even further. For the digital-to-analog converter 200, the first switchable capacitor 208a and the second switchable capacitor 208b are configured to operate independently to increase a dynamic bit range of the digital-to-analog converter 200. Moreover, a plurality of first switchable capacitors 208a may be configured in parallel to the primary coil 204a to increase a dynamic bit range of the digital-to-analog converter 200 even further. Similarly, a plurality of second switchable capacitors 208b may be configured in parallel to the secondary coil 204b. These measures can increase the dynamic bit range of the digital-to-analog converter 200 from approximately 4 bits to approximately 10 bits.

The digital-to-analog converter 200 further comprises a plurality of first current sources 210a-210n configured in parallel and arranged to provide respective output currents based on a multi-bit digital input (i.e., an n-bit modulated digital input from a local oscillator, LO). The digital-to-analog converter 200 further comprises a first current summing path 214a configured to sum output currents from the plurality of first current sources 210a-210n, which serves as a first input to the switchable transformer 202. To reduce capacitive coupling a plurality of second current sources 212a-212n configured in parallel are employed, wherein a respective second current source 212a-212n comprises a respective inverted first current source. The plurality of second current sources 212a-212n are configured to provide respective output currents based on a multi-bit digital input (i.e., an inverted modulated digital input from the local oscillator, $\overline{LO}$). A second current summing path 214b is configured to sum outputs from the plurality of second current sources 212a-212n, which serves as a second input to the switchable transformer 202.

The digital-to-analog converter 200 further comprises a capacitive digital-to-analog converter, wherein a respective first current source 210a-210n comprises a capacitor 216a-216n configured in series with an output of an inverter 220a-220n respectively, to provide impedance matching and capacitive decoupling between the plurality of first current sources 210a-210n. Likewise, a respective second current source 212a-212n comprises a capacitor 218a-218n configured in series with an output of an inverter 222a-222n respectively, to provide impedance matching and capacitive decoupling between the plurality of second current sources 212a-212n.

Figure 3:
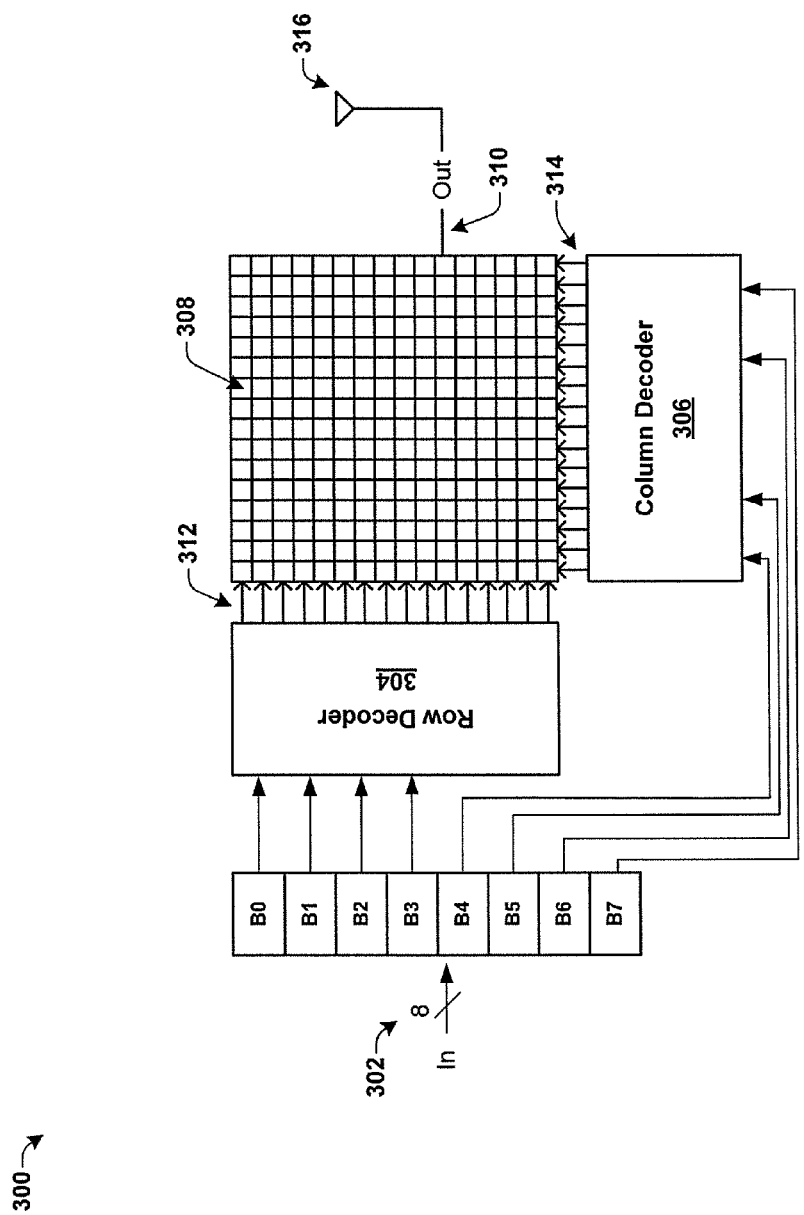
FIG. 3 illustrates a block diagram of a mixing digital-to-analog converter that uses local oscillator modulated control signals.

FIG. 3 illustrates a block diagram of a mixing DAC 300 that uses local oscillator LO-modulated control signals. The mixing DAC 300 includes an input 302, row and column decoders, 304 and 306 respectively, a cell array 308, and an output 310, which is coupled to a wireless antenna 316. The column decoder 306 and row decoder 304 provide control signals in the form of row and column thermometer encoded control signals (312 and 314, respectively). In the example of FIG. 3, the input 302 receives a multi-bit digital signal in the form of an 8-bit signal, the bits being denoted B0 to B7 in FIG. 3. Bits B0 to B3, which may be the least significant four bits, are fed to thermometer row decoder 304; while bits B4 to B7, which may be the most significant four bits, are fed to thermometer column decoder 306. Thermometer row decoder 304 and thermometer column decoder 306 control cell array 308 which comprises $2^8$ (i.e., 256) cells. When activated by a control signal from the column decoder 306 and row decoder 304, a current source within a respective cell of cell array 308 outputs a predetermined current, wherein the predetermined current output by a cell is the same as that of each other cell. These currents from any individual activated cells are summed to generate analog output signal 310.

The number of activated cells in cell array 308 depends on the eight bit value B0 to B7. For example, if a digital value of 00000000 (corresponding to a decimal value of zero) is set for B0-B7 and applied to the input 302, no cell in cell array 308 is activated and the output current on output 310 is zero. On the other hand, if all bits are set (i.e., B0-B7 are set to a digital value of 11111111, corresponding to a decimal value of 255), all cells in cell array 308 are activated to yield an output signal 310 which essentially is 256 times stronger than the output of a single cell.

A dynamic bit range of the mixing DAC 300 is dependent upon the number of unit cells in cell array 308. Increasing the dynamic bit range of the mixing DAC 300 exponentially increases the number of unit cells in cell array 308, which in turn exponentially increases the die-area of the mixing DAC 300. One solution to increase the dynamic bit range of the mixing DAC 300 is to couple the DAC 200 with a programmable load of FIG. 2 to the output 310 to increase the dynamic bit range.

Figure 4:
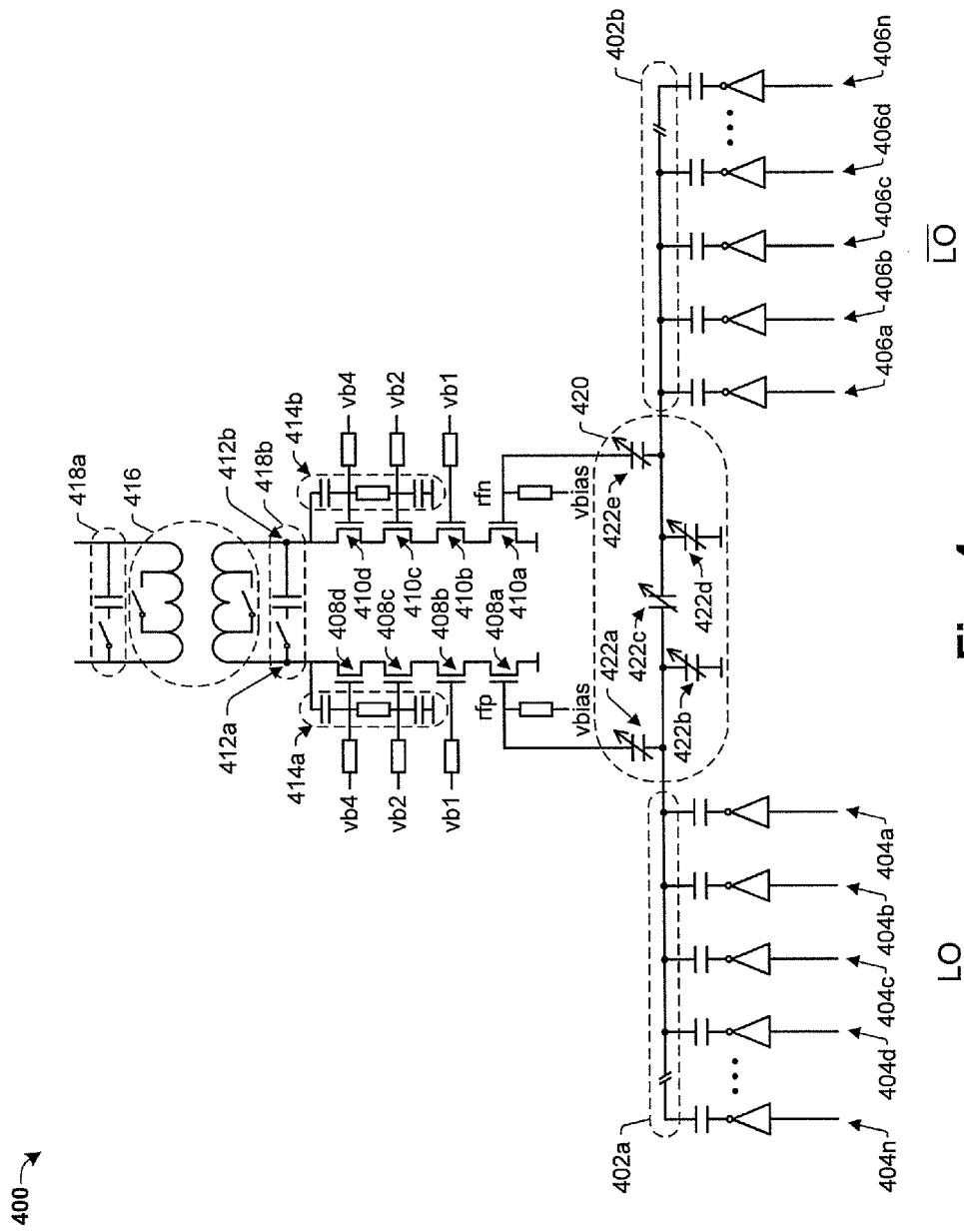
FIG. 4 illustrates an exemplary digital-to-analog converter with a programmable load and a power amplifier.

FIG. 4 illustrates an exemplary digital-to-analog converter 400 with a programmable load and a power amplifier. A first current summing path 402a configured to sum output currents from a plurality of first current sources 404a-404n configured in parallel and arranged to provide respective output currents based on a multi-bit digital input (LO). To reduce capacitive coupling a second current summing path 402b configured to sum output currents from a plurality of second current sources 406a-406n configured in parallel and arranged to provide respective output currents based on a multi-bit digital input ($\overline{LO}$).

The digital-to-analog converter 400 further comprises a first amplifier stage comprising a plurality of stacked transistors 408a-408d having inputs connected to the first current summing path 402a and outputs connected to the programmable load. The first plurality of stacked transistors 408a-408d are coupled in series form a connection between the first input 412a of a switchable transformer 416 and the first current summing path 402a. The first plurality of stacked transistors 408a-408d are coupled to a first voltage ladder 414a to provide power amplification of an output of the first current summing path 402a prior to delivery of the output to the switchable transformer 416 with a first switchable capacitor 418a configured in parallel to a primary coil of the switchable transformer 416, and a second switchable capacitor 418b configured in parallel to a secondary coil of the switchable transformer 416. A second amplifier stage comprising a second plurality of stacked transistors 410a-410d coupled in series form a connection between the second input 412b of the switchable transformer 416 and the second current summing path 402b. The second plurality of stacked transistors 410a-410d are coupled to a second voltage ladder 414b to provide power amplification of an output of the second current summing path 402b.

An exemplary digital-to-analog converter coupled to power amplifiers requires a transformer dedicated towards tuning a DC component of an input power to the power amplifier to a desired value. For a capacitive digital-to-analog converter, an output signal is decoupled by capacitors. So the bias voltage of input of the power amplifier can be freely chosen. Moreover, for the digital-to-analog converter 400 a capacitive decoupling network 420 or any combination of capacitors 422a-422e can be used for damping a radio-frequency signal to increase gain range. The first current summing path 402a is connected by capacitor 422b to the input of the first amplifier stage. The second current summing path 402b is connected by capacitor 422e to an input of the second amplifier stage. An exemplary decoupling network 420 comprises at least one switched capacitance connected to the output of the first current summing path 402a and input of the first amplifier stage, the output of the second current summing path 402b and input of the second amplifier stage, or both, input to increase gain range. In another exemplary digital-to-analog converter 400, capacitors 422a-422e comprise switched capacitors.

Figure 5:
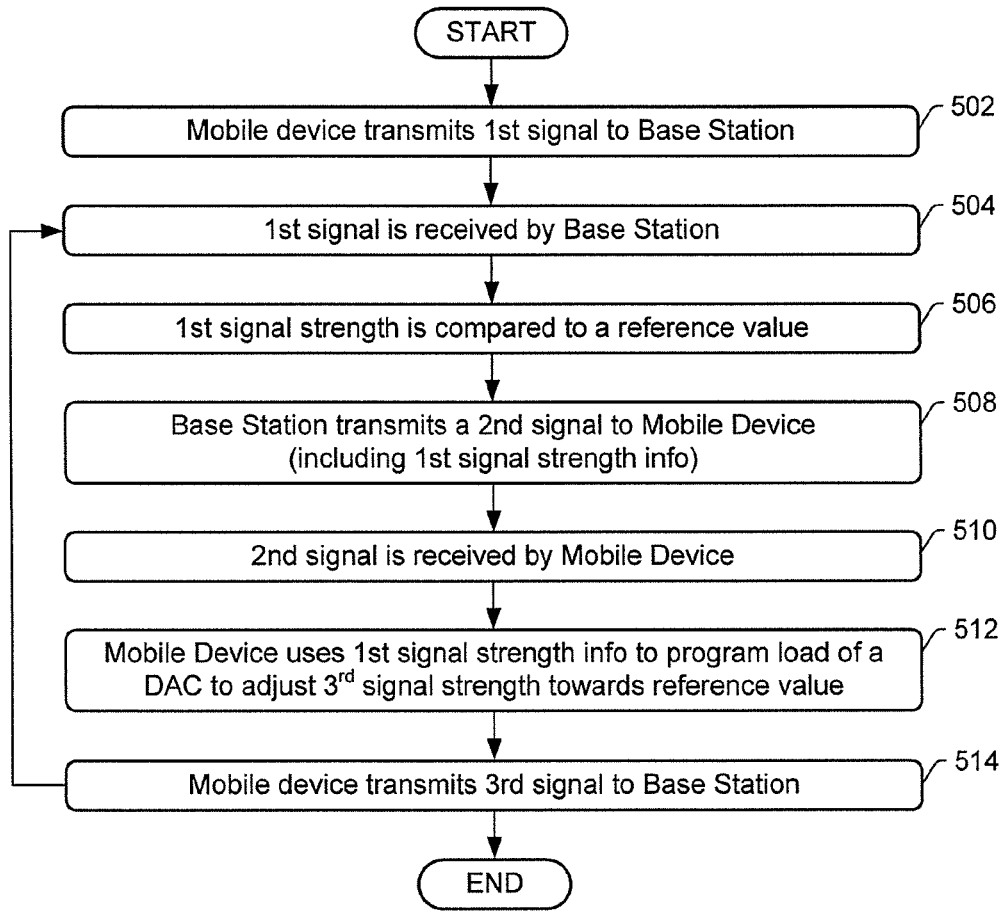
FIG. 5 illustrates a flow diagram of an exemplary method of programming a load of a digital-to-analog converter to optimize signal efficiency.

FIG. 5 illustrates an exemplary method 500 of programming a load of a digital-to-analog converter to optimize signal efficiency. While method 500 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or exemplary representations of the description herein. Further, one or more of the acts depicted herein may be carried out in one or more separate acts and/or phases.

At 502 a first device converts a first digital signal to a first analog signal using a digital-to-analog converter with a programmable load housed within the first device, and transmits the first analog signal from the first device to a second device. The first device may comprise a mobile communications device and the second device may comprise a respective base station from a plurality of base stations which comprise a wireless network.

At 504 the second device receives the first analog signal. An exemplary representation of a wireless network comprises a plurality of base stations, wherein the first analog signal may be received by multiple base stations. In such instances the wireless network will assign a primary base station.

At 506 the second device compares a first analog signal strength of the first analog signal to a reference value. For instances wherein the signal is received by multiple base stations a primary base station is assigned as a base station which receives a largest first analog signal strength.

At 508 the second device transmits a second signal as an analog signal. The second signal comprises information about the strength of the first analog signal relative to the reference value.

At 510 the first device receives the second signal.

At 512 the first device adjusts the programmable load of the digital-to-analog converter so that a third analog signal strength is approximately the reference value. Adjusting the programmable load of the digital-to-analog converter further comprises varying an inductance of one of more sides of a switchable transformer by varying a first number of active windings on a primary coil of the switchable transformer with a first switch transistor, varying a second number of active windings on a secondary coil of the switchable transformer with a second switch transistor, of a combination thereof. Adjusting the programmable load of the digital-to-analog converter may further comprise enabling or disabling a first switchable capacitor configured in parallel to the switchable transformer, enabling or disabling a second switchable capacitor configured in parallel to the switchable transformer, of a combination thereof, to increase a dynamic bit range of the digital-to-analog.

At 514 the first device transmits a third analog signal to the second device with a third analog signal strength that is approximately the reference value. Furthermore, 504-514 may occur iteratively (e.g., 504-512 are repeated for the third analog signal, and a fifth analog signal is produced at 514, etc.). An example of this includes, but is not limited to, a scenario wherein the first device comprises a mobile communications device which is inside a moving car wherein an analog signal strength of a signal produced by the mobile communications device is continuously updated based on feedback from the second device comprising one or more base stations comprising a wireless network.

Figure 6:
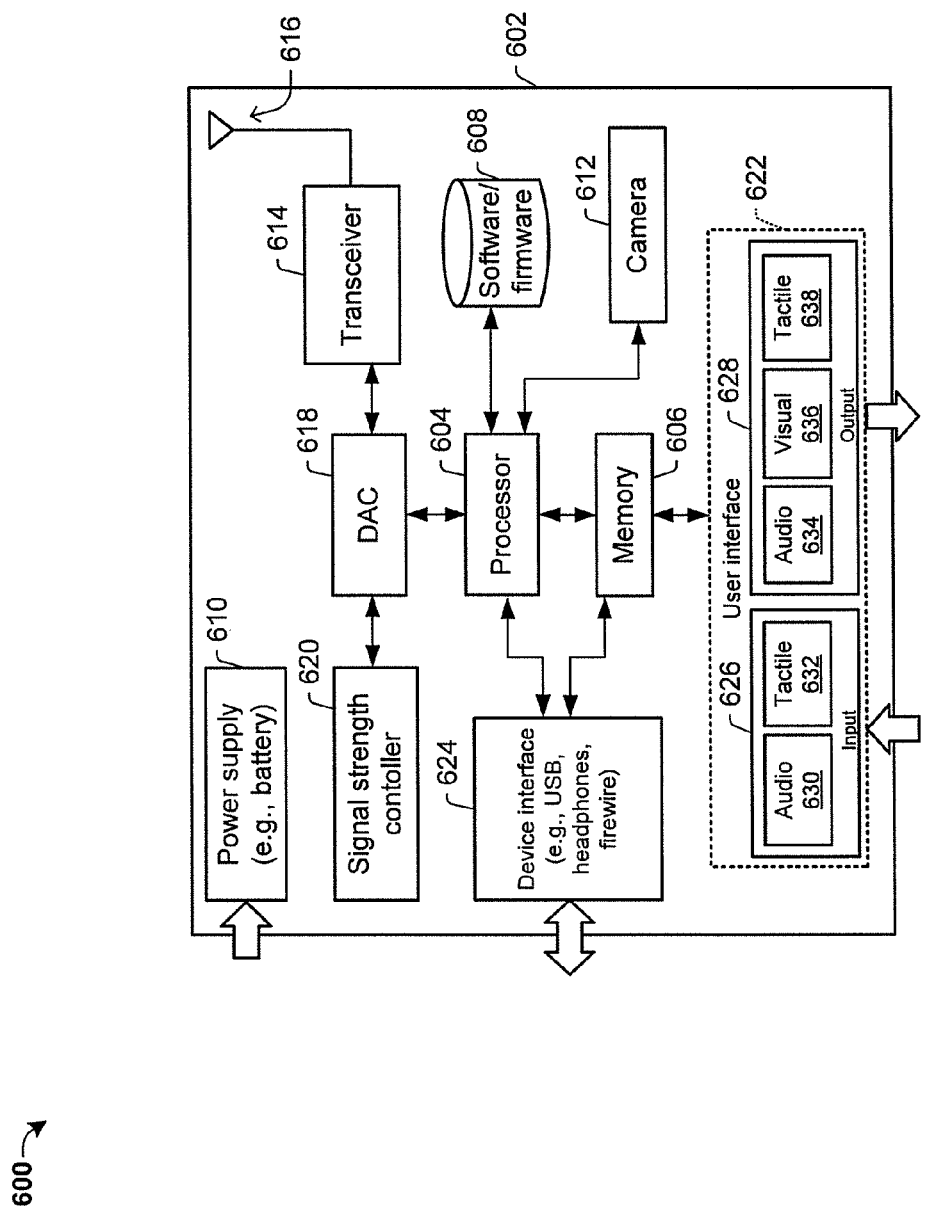
FIG. 6 illustrates an exemplary system comprising a mobile communication device.

FIG. 6 and the following discussion provide a brief, general description of a suitable mobile communication device 602 to implement exemplary representations of one or more of the provisions set forth herein. Mobile communication device 602 is merely one possible device in which a Cap-RF-DAC as set forth above may be used, and it will be appreciated that the Cap-RF-DAC may also be used with other communications systems. Thus, Mobile communication device 602 is only one example of a suitable operating environment for the Capacitive RF-DAC and is not intended to suggest any limitation as to the scope of use or functionality of the operating environment. Example mobile communication devices include, but are not limited to, mobile devices (such as mobile phones, Personal Digital Assistants (PDAs), media players, and the like), tablets, personal computers, server computers, handheld or laptop devices, multiprocessor systems, consumer electronics, mini computers, mainframe computers, distributed computing environments that include any of the above systems or devices, and the like.

FIG. 6 illustrates an exemplary system 600 comprising a mobile communication device 602, such as a mobile phone handset for example, configured to implement one or more exemplary representations provided herein. In one configuration, mobile communication device 602 includes at least one processing unit 604 and memory 606. Depending on the exact configuration and type of mobile communication device, memory 606 may be volatile (e.g., RAM), non-volatile (e.g., ROM, flash memory, etc.), or some combination thereof. Memory 606 may be removable and/or non-removable, and may also include, but is not limited to, magnetic storage, optical storage, and the like. An exemplary representation of system 600 comprises computer readable instructions in the form of software/firmware 608 to implement one or more provisions provided herein may be stored in memory 606. Memory 606 may also store other computer readable instructions to implement an operating system, an application program, and the like. Computer readable instructions may be loaded in memory 606 for execution by processing unit 604, for example. Other peripherals, such as a power supply 610 (e.g., battery) and a camera 612 may also be present.

Processing unit 604 and memory 606 work in coordinated fashion along with a transmitter and/or receiver 614 to wirelessly communicate with other devices. To facilitate this wireless communication, a wireless antenna 616 is coupled to transceiver 614, which is coupled to a digital-to-analog converter with a programmable load (DAC) 618. During wireless communication, transceiver 614 may use frequency modulation, amplitude modulation, phase modulation, and/or combinations thereof to communicate signals to another wireless device, such as a base station for example. The DAC 618 receives a digital signal from the processing unit 604 and converts the digital signal to an RF analog signal. A signal strength controller 620 receives information about a strength of a transmitted signal and adjusts a load of the DAC 618 for subsequent signal transmission (possibly in conjunction with processing unit 604 and memory 606 and software/firmware 608) to facilitate efficient power usage of the mobile communication device 602.

To improve a user's interaction with mobile communication device 602, mobile communication device 602 may also include a number of interfaces that allow mobile communication device 602 to exchange information with the external environment. These interfaces may include one or more user interface(s) 622, and one or more device interface(s) 624, among others.

If present, user interface 622 may include any number of user inputs 626 that allow a user to input information into mobile communication device 602, and may also include any number of user outputs 628 that allow a user to receive information from mobile communication device 602. In an exemplary representation, the user inputs 626 may include an audio input 630 (e.g., a microphone) and/or a tactile input 632 (e.g., push buttons and/or a keyboard). In some mobile phone systems, the user outputs 628 may include an audio output 634 (e.g., a speaker), a visual output 636 (e.g., an LCD or LED screen), and/or tactile output 638 (e.g., a vibrating buzzer), among others.

Device interface 624 allows mobile communication device 602 to communicate with other electronic devices. Device interface 624 may include, but is not limited to, a modem, a Network Interface Card (NIC), an integrated network interface, a radio frequency transmitter/receiver, an infrared port, a USB connection, or other interfaces for connecting mobile communication device 602 to other mobile communication devices. Device interface 624 may include a wired connection or a wireless connection. Device interface 624 may transmit and/or receive communication media.

Figure 7:
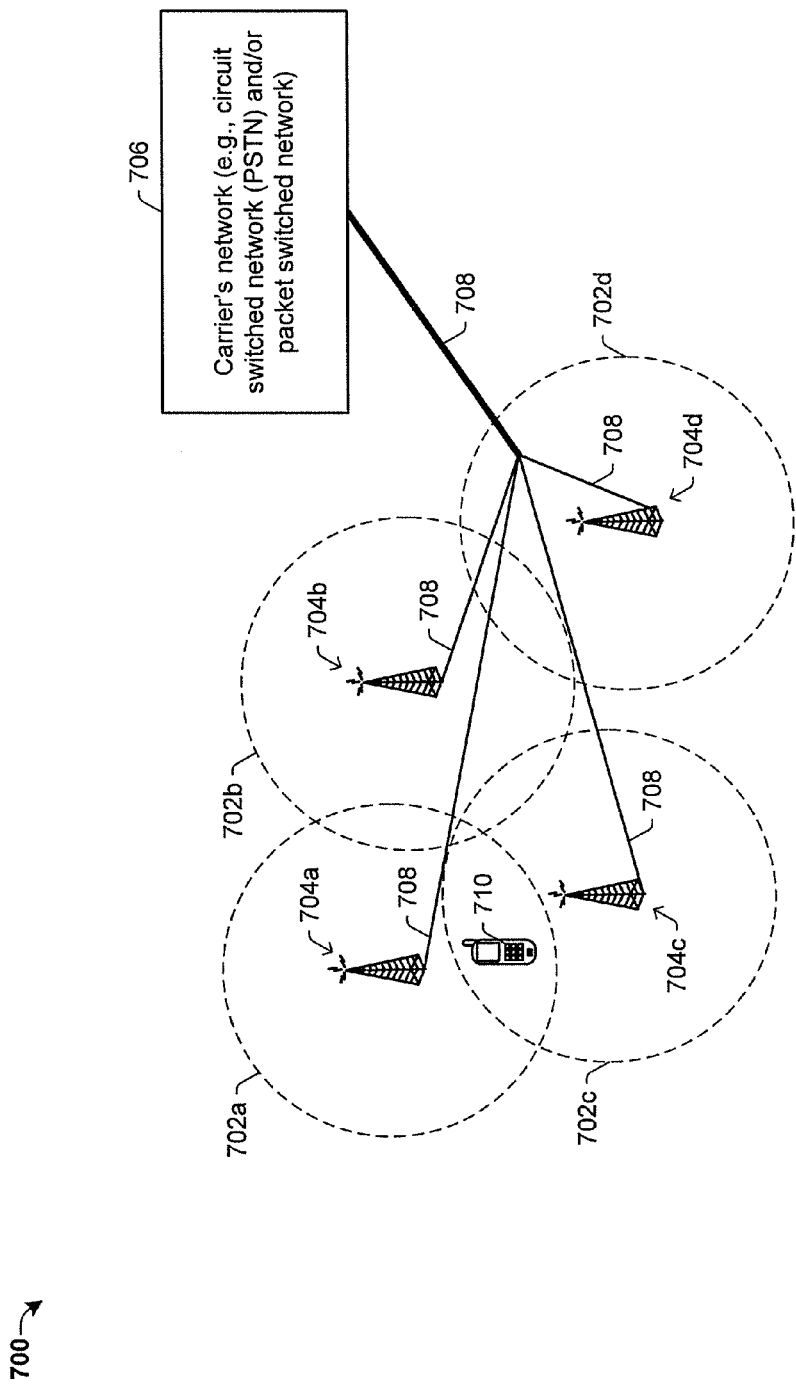
FIG. 7 illustrates an exemplary wireless network over which a mobile communication device may communicate.

FIG. 7 illustrates an exemplary wireless network 700 over which a mobile communication device (e.g., mobile communication device 602 in FIG. 6) may communicate. The wireless network 700 is divided into a number of cells (e.g., 702a, 702b, 702c, and 702d), wherein each cell has one or more base stations (e.g., 704a, 704b, 704c, and 704d, respectively). Each base station is coupled to a carrier's network 706 (e.g., a packet switched network, or a circuit switched network such as the public switched telephone network or PSTN) via one or more wirelines 708.

A mobile handset (e.g., mobile communication device 602) or other mobile device 710 while residing within a given cell, may establish communication with a respective base station (e.g., 704a, 704b, 704c, or 704d) within that cell (e.g., 702a, 702b, 702c, or 702d, respectively), via one or more of frequency channels used for communication in that cell. The communication between a mobile handset or other mobile device 710 and a corresponding base station (e.g., 704a, 704b, 704c, or 704d) often proceeds according to established standard communication protocol, such as LTE, GSM, CDMA or others. When a base station establishes communication with a mobile handset or other mobile device, the base station may establish communication with another external device via the carrier's network 706, which may then route communication though the phone network.

Those skilled in the art will realize that mobile communication devices such as mobile phones may in many instances upload and download computer readable instructions from a network through the base stations. For example, a mobile handset or other mobile device 710 accessible via network 706 may store computer readable instructions to implement one or more exemplary representations provided herein. The mobile handset or other mobile device 710 may access a network and download a part or all of the computer readable instructions for execution.

The term "computer readable media" as used herein includes computer storage media. Computer storage media includes volatile and nonvolatile, removable and non-removable media implemented in any method or technology for storage of information such as computer readable instructions or other data. Memory (e.g., 706 in FIG. 7) is an example of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which may be used to store the desired information. The term "computer readable media" may also include communication media. Communication media typically embodies computer readable instructions or other data in a "modulated data signal" such as a carrier wave or other transport component and includes any information delivery media. The term "modulated data signal" may include a signal that has one or more of its characteristics set or changed in such a manner as to encode information in the signal.

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited by said modifications and alterations. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein; such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A digital-to-analog converter with a programmable load, comprising:
   a first multi-bit digital input comprising a plurality of first current sources configured in parallel and arranged to provide an output current based on a multi-bit digital input;
   a first current summing path configured to sum output currents from the plurality of first current sources;
   a switchable transformer having a first input coupled to the first current summing path, and configured to vary an inductance of one of more sides of the switchable transformer; and
   an analog output.

2. The digital-to-analog converter of claim 1, further comprising:
   a second multi-bit digital input comprising a plurality of second current sources configured in parallel, wherein a respective second current source comprises an inverted first current source; and
   a second current summing path configured to sum outputs from the plurality of second current sources;
   wherein the switchable transformer receives a second input from the second current summing path.

3. The digital-to-analog converter of claim 1, wherein the switchable transformer further comprises:
   a primary coil consisting of a first number of N active windings;
   a secondary coil consisting of a second number of M active windings; and
   a first switch transistor connected to the primary coil, and configured to change the first number of active windings of the primary coil from 1 to N, varying a transfer ratio of the switchable transformer between N:M and 1:M.

4. The digital-to-analog converter of claim 3, wherein the switchable transformer further comprises a second switch transistor connected to the secondary coil, and configured to change the second number of active windings of the secondary coil from 1 to M, varying the transfer ratio of the switchable transformer between N:M and N:1.

5. The digital-to-analog converter of claim 4, further comprising a first switchable capacitor configured in parallel to the primary coil of the switchable transformer.

6. The digital-to-analog converter of claim 5, further comprising a second switchable capacitor configured in parallel to the secondary coil of the switchable transformer, wherein the first switchable capacitor and the second switchable capacitor are configured to operate independently.

7. The digital-to-analog converter of claim 6, further comprising:
   a plurality of first switchable capacitors configured in parallel with each other and the primary coil; and
   a plurality of second switchable capacitors configured in parallel with each other and the secondary coil;
   wherein the plurality of first switchable capacitors and the plurality of second switchable capacitors are configured to operate independently.

8. The digital-to-analog converter of claim 1, further comprising an amplifier stage comprising a plurality of stacked transistors having inputs connected to the first current summing path and outputs connected to the programmable load.

9. The digital-to-analog converter of claim 8, wherein the first current summing path is connected by a capacitor to an input of the amplifier stage.

10. The digital-to-analog converter of claim 8, further comprising a capacitive decoupling network connected to the first current summing path and input of the amplifier stage, wherein the capacitive decoupling network comprises at least at least one switched capacitance.

11. The digital-to-analog converter of claim 1, further comprising a capacitive digital-to-analog converter wherein a respective first current source comprises a capacitor configured in series with an output of an inverter.

12. The digital-to-analog converter of claim 1, wherein a respective first current source receives a modulated digital input from a local oscillator.

13. A method of programming a load of a digital-to-analog converter to optimize signal efficiency, comprising:
   converting a first digital signal to a first analog signal with a digital-to-analog converter with a programmable load;
   transmitting the first analog signal from a first device to a second device;
   receiving the first analog signal at the second device;
   comparing a first analog signal strength to a reference value;
   receiving a second signal which comprises information about the first analog signal strength relative to the reference value;
   adjusting the programmable load of the digital-to-analog converter so that a third analog signal strength is approximately the reference value; and
   sending a third analog signal from the first device to the second device.

14. The method of claim 13, further comprising:
   comparing the first analog signal strength to the reference value in the second device; and
   transmitting the second signal as an analog signal which is received by the first device.

15. The method of claim 13, wherein adjusting the programmable load of the digital-to-analog converter further comprises varying an inductance of one of more sides of a switchable transformer, varying a transfer ratio of a transformer resulting in a switchable trans-impedance gain of the transformer.

16. The method of claim 15, wherein varying the inductance of one of more sides of the switchable transformer further comprises varying a first number of active windings on a primary coil of the switchable transformer with a first switch transistor, varying a second number of active windings on a secondary coil of the switchable transformer with a second switch transistor, of a combination thereof, to increase a dynamic bit range of the digital-to-analog converter.

17. The method of claim 16, wherein adjusting the programmable load of the digital-to-analog converter further comprises enabling or disabling a plurality of first switchable capacitors configured in parallel with each other and the primary coil, enabling or disabling a plurality of second switchable capacitors configured in parallel with the secondary coil and each other, of a combination thereof, to increase the dynamic bit range of the digital-to-analog converter.

18. A mobile communication device, comprising:
   a wireless antenna coupled to a transceiver;
   a digital-to-analog converter with a programmable load coupled to the transceiver and configured to deliver an analog signal to the transceiver;
   a processing unit coupled to the digital-to-analog converter and configured to deliver a multi-bit digital input to the multi-bit digital input to the digital-to-analog converter; and
   a signal strength controller coupled to the digital-to-analog converter and configured to receive information about a strength of a transmitted signal and to adjust a load of the digital-to-analog converter for signal transmission.

19. The mobile communication device of claim 18, wherein the digital-to-analog converter with a programmable load further comprises a switchable transformer comprising:
- a primary coil consisting of a first number of N active windings;
- a secondary coil consisting of a second number of M active windings;
- a first switch transistor connected to the primary coil, and configured to change the first number of active windings of the primary coil from 1 to N; and
- a second switch transistor connected to the secondary coil, and configured to change the second number of active windings of the secondary coil from 1 to M;
- wherein the first switch transistor and second switch transistor are configured to operate independently, varying a transfer ratio of the switchable transformer between N:1 and 1:M.

20. The mobile communication device of claim 19, wherein the digital-to-analog converter with a programmable load further comprises:
- a plurality of first switchable capacitors configured in parallel with each other and the primary coil of the switchable transformer; and
- a plurality of second switchable capacitors configured in parallel with each other and the secondary coil of the switchable transformer;
- wherein the plurality of first switchable capacitors and the plurality of second switchable capacitors are configured to operate independently.

* * * * *